(12) United States Patent
Jung et al.

(10) Patent No.: US 9,141,925 B2
(45) Date of Patent: Sep. 22, 2015

(54) SYSTEM AND METHOD FOR CREATING BUILDING INFORMATION MODELING GEOMETRY BREAKDOWN STRUCTURE

(71) Applicant: MYONGJI UNIVERSITY INDUSTRY AND ACADEMIA COOPORATION FOUNDATION, Gyeonggi-do (KR)

(72) Inventors: Youngsoo Jung, Gyeonggi-do (KR); Yunsub Lee, Gyeonggi-do (KR); Yesol Kim, Gyeonggi-do (KR); Min Kim, Gyeonggi-do (KR)

(73) Assignee: Myongji University Industry and Academia Cooperation Foundation, Gyeonggi-do (KR)

( * ) Notice: Subject to any disclaimer, the term of this patent is extended or adjusted under 35 U.S.C. 154(b) by 302 days.

(21) Appl. No.: 13/830,705

(22) Filed: Mar. 14, 2013

(65) Prior Publication Data
US 2014/0200945 A1   Jul. 17, 2014

(30) Foreign Application Priority Data
Jan. 11, 2013   (KR) .................. 10-2013-0003321

(51) Int. Cl.
*G06Q 10/06*       (2012.01)
*G06F 17/50*       (2006.01)

(52) U.S. Cl.
CPC .......... *G06Q 10/06313* (2013.01); *G06F 17/50* (2013.01)

(58) Field of Classification Search
None
See application file for complete search history.

(56) References Cited

FOREIGN PATENT DOCUMENTS

| KR | 10-2011-0099151 A | 9/2011 |
|---|---|---|
| KR | 10-1081880 B1 | 11/2011 |
| KR | 10-1105327 B1 | 1/2012 |

OTHER PUBLICATIONS

Gibbels, "Global Coordination at ITER", downloaded at http://www.power-eng.com/articles/npi/print/volume-2/issue-4/technology/global-coordination-at-iter.html, available online since Dec. 1, 2009.*
Youngsoo Jung et al., "Building information modeling (BIM) framework for practical implementation", Automation in Construction, 2011, pp. 126-133, vol. 20, No. 2.
K.W. Chau et al., "4D dynamic construction management and visualization software: 1. Development", Automation in Construction, 2005, pp. 512-524, vol. 14, No. 4.
(Continued)

*Primary Examiner* — Yingchun He
(74) *Attorney, Agent, or Firm* — Rabin & Berdo P.C.

(57) ABSTRACT

Disclosed herein is a system and method for generating a BIM geometry breakdown structure. The system includes a geometry breakdown system (GBS) range setting module, a GBS geometric object coding module, and a GBS geometric object coding module. The GBS range setting module sets the range of a GBS based on BIM framework variables. The GBS element definition module generates "standard information breakdown property information" that is used to manage work-type breakdown and location breakdown, "project numbering system (PNS) property information" that is used to manage a work breakdown system (WBS), a cost breakdown structure (CBS), and a standard-method-of-measurement (SMM) breakdown structure (MBS), and "GBS property information" that is used to define geometric information. The GBS geometric object coding module matches geometric objects to the "standard information breakdown property information" and the "PNS property information", and assigns numbers corresponding to the "GBS property information" to the matched geometric objects.

12 Claims, 12 Drawing Sheets

(56) References Cited

OTHER PUBLICATIONS

L.Y. Ding et al., "Using nD technology to develop an integrated construction management system for city rail transit construction", Automation in Construction, 2012, pp. 64-73, vol. 21, No. 1.

Youngsoo Jung et al., "Standard Classifications and Project Numbering System for Integrated Construction Management of Modernized Korean Housing (Hanok)", Transactions of the Society of CAD/CAM Engineers, Aug. 2012, pp. 225-233, vol. 17, No. 4.

Wangjik Kim, "Korea-Style House Technique Development", First Workshop for the Third Year of Korean-Style House Technique Development, Sep. 2011, Seoul.

Youngsoo Jung et al., "Flexible Work Breakdown Structure for Integrated Cost and Schedule Control", Journal of Construction Engineering and Management, Sep./Oct. 2004, pp. 616-625.

* cited by examiner

SYSTEM AND METHOD FOR CREATING BUILDING INFORMATION MODELING GEOMETRY BREAKDOWN STRUCTURE

BACKGROUND OF THE INVENTION

1. Field of the Invention

The present invention relates generally to a system and method for generating a building information modeling (BIM) geometry breakdown structure and, more particularly, to technology for generating a geometry breakdown structure, which enables a breakdown structure for associating geometric information with non-geometric information to be set in the geometric information and associates the geometric information with the non-geometric information.

2. Description of the Related Art

Among various efforts to accomplish construction informatization, recently, the utilization of BIM has rapidly advanced and become more common, and the form of the utilization has gradually trended toward "high-level utilization" and "high efficiency." In spite of this, it has been pointed out that the burden of the vast amount of additional work that is required to put BIM to practical use is the principal obstacle to the practical application of BIM.

In the early 1990s, integrated construction informatization was materialized via the concept of computer integrated construction (CIC). In general, CIC is implemented as an integrated system that is comprehensive and has high completeness in terms of its life cycle and work functionality, in large-scale construction organizations or projects.

Meanwhile, it is appreciated that BIM has been developed in the direction of expansion in such a way that it started with the utilization of three-dimensional (3D) geometric information in relatively small organizations, has expanded its integration range to encompass the integration of design/construction/maintenance, and has been provided with a wide variety of analysis functions (see Jung, Y. and Joo, M. (2011). "Building Information Modeling (BIM) Framework for Practical Implementation.", Automation in Construction, 20(2), pp. 126~133).

In both the above-described "comprehensive CIC and expandable BIM," one of the important element technologies is a method of associating geometric information (e.g., 3D computer-aided design (CAD) data) with non-geometric information (e.g., schedule information). In such integration, physical integration can be handled by commercial software, but logical integration requires a project management viewpoint-based effort to make a method that is suitable for project characteristics.

In general, to associate geometric information with non-geometric information, a large amount of effort is required. The amount of association work is dependent upon "the diversity of construction business functions" and "the degree of details of an association target." That is, five-dimensional (5D)-CAD that performs the association of schedule and cost information requires a larger amount of more complicated work than four-dimensional (4D)-CAD that associates 3D geometric information with only schedule information. Furthermore, the complexity of a structure is proportional to the degree of details of association target data (for example, schedule activity association with cost data for each member, not for each story).

Another consideration is that from the viewpoint of "the variety of construction business functions," the task of logically associating non-geometric information, other than geometric information, itself is a very complicated task that requires much effort (e.g., a cost and schedule integration structure). The fact that a scheme for the efficiency of Earned Value Management Systems (EVMSs) is still being discussed actively confirms this (see Jung, Y. and Woo, S. (2004). "Flexible Work Breakdown Structure for Integrated Cost and Schedule Control", Journal of Construction Engineering and Management, 130(5), pp. 616-625).

The above-described complicated logical association of geometric information with non-geometric information is performed basically based on a breakdown structure, such as a work breakdown structure (WBS). A lot of BIM-related research deals with schemes for the association of geometric information and non-geometric information, but the schemes are not main topics and are dealt with from a secondary viewpoint.

Representative examples of comprehensive WBS research in the BIM field include a case that proposes a scheme for associating geometric information with non-geometric information from the viewpoint of system development (see Chau, K. W. Anson, M. and Zhang, J. P. (2005). "4D Dynamic Construction Management and Visualization Software: 1. Development." Automation in Construction, 14(4), pp. 512~524), and a case that effectively associates 3D-CAD with the schedule, the cost, and the safety from a project management-oriented viewpoint and applies the association to railroad construction (see Ding, L. Y. Zhou, Y. Luo, H. B. and Wu, X. G. (2012). "Using nD Technology to Develop an Integrated Construction Management System for City Rail Transit Construction", Automation in Construction, 21(1), pp. 64~73).

However, both of these two examples of research are limited in that they fail to distinguish themselves from the previous pieces of research, because the application of the numbering system of the two examples employs a method of starting with non-geometric information (that is, with a WBS and a cost breakdown structure (CBS)) and then associating the non-geometric information with geometric information.

Meanwhile, Korean Patent Application Publication No. 10-2011-0099151 entitled "Industry Foundation Classes (IFC)-based Architecture Object Standardization Method" relates to an IFC-based architecture object standardization method, and discloses technology that fabricates standardized logical 3D shapes, that is, architecture objects, through the formation of IFC-based relationships using information (hierarchical space information, location information, and object characteristic information) necessary for architecture objects input at the same time that modeling starts and automatically configures those as physical shapes using various programs.

However, the technology disclosed in the above-described preceding patent application is problematic in that it does not take into consideration the interoperability between various characteristics, various processes, and users having various businesses in the field of the construction industry, and is disadvantageous in that it is difficult for a single integrated vendor solution to integrate information in various separate fields.

The reason for this is that each company uses unique and distinctive design, analysis and maintenance tools in its building process.

Additionally, there is another reality in that since each building is unique in terms of design concept, material and a project team's requirements, a project team is usually disbanded after a building has been constructed, and design elements, a combination method and the use of project participants are limited in a subsequent project.

Existing structure definition breakdown structures, such as a WBS and a CBS, that have been used in practice and research up to now assign numbers chiefly to "non-geometric data," such as scope, schedule, and cost management. Although these non-geometric data breakdown structures have been popularly put into practical use and have been widely utilized, the direct application of the WBS or CBS to geometric data (e.g., 3D-CAD data) has many limitations because of the characteristics of non-geometric data.

In contrast, CIC or BIM research based on the integration of "geometric data" and "non-geometric data" (nD-CAD data) mostly employs a method of association with the WBS and CBS of non-geometric data using mechanical association functionality and an interface provided by existing software, and thus does not propose an active and systematic association method.

SUMMARY OF THE INVENTION

Accordingly, the present invention has been made keeping in mind the above problems occurring in the prior art, and an object of the present invention is to provide a system and method for generating a BIM geometry breakdown structure, which are capable of acquiring project numbering system (PNS) association requirements suitable for BIM geometry breakdown characteristics, thereby generating the framework of a PNS that provides geometric information that enables the comprehensive integration of a WBS and a CBS.

In order to accomplish the above object, the present invention provides a system for generating a BIM geometry breakdown structure, including a geometry breakdown structure (GBS) range setting module configured to set the range of a GBS based on previously generated BIM framework variables; a GBS element definition module configured to generate "standard information breakdown property information" that is used to manage work-type breakdown and location breakdown, to generate "project numbering system (PNS) property information" that is used to manage a work breakdown system (WBS), a cost breakdown structure (CBS), and a standard-method-of-measurement (SMM) breakdown structure (MBS), and to generate "GBS property information" that is used to define geometric information (property values of a 3D-CAD or an IFC viewer program); and a GBS geometric object coding module configured to match geometric objects to the "standard information breakdown property information" and the "PNS property information" generated by the GBS element definition module, and to assign numbers corresponding to the "GBS property information" to the matched geometric objects.

In order to accomplish the above object, the present invention provides a method of generating a BIM geometry breakdown structure e, including (a) setting, by a GBS range setting module, the range of a GBS based on previously generated BIM framework variables; (b) generating, by a GBS element definition module, "standard information breakdown property information" that is used to manage work-type breakdown and location breakdown, "PNS property information" that is used to manage a WBS, a CBS, and an MBS, and "GBS property information" that is used to define geometric information (property values of a 3D-CAD or an IFC viewer program); and (c) matching, by a GBS geometric object coding module, geometric objects to the "standard information breakdown property information" and the "PNS property information" generated by the GBS element definition module, and assigning, by the GBS geometric object coding module, numbers corresponding to the "GBS property information" to the matched geometric objects.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Prior to the following description, the terms and words that are used in the cost estimate specification and the claims should be construed as having meanings and concepts that meet the technical spirit of the present invention based on the principle that an inventor may appropriately define terms and words to describe his or her invention in the best way. Furthermore, it should be noted that detailed descriptions of known present invention-related functions and configurations that would make the gist of the present invention obscure will be omitted below.

Figure 1:
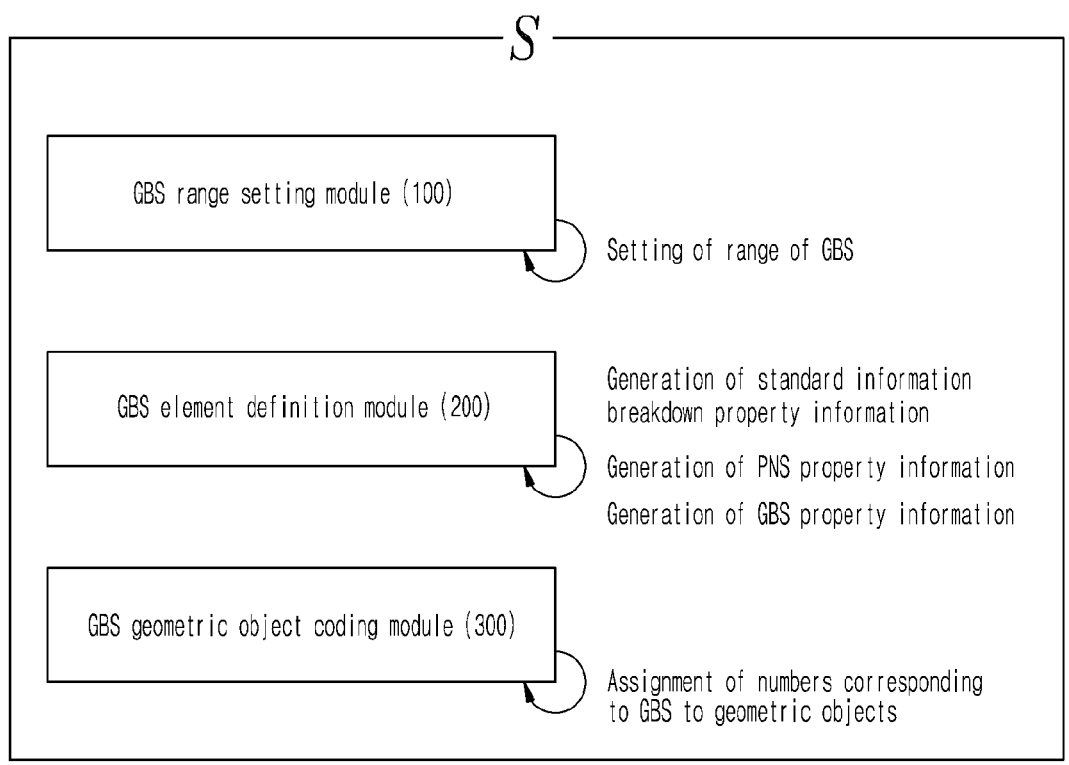
FIG. 1 is a diagram illustrating the configuration of a system for generating a BIM geometry breakdown structure according to the present invention.

As illustrated in FIG. 1, the GBS range setting module 100 of a system S for generating a BIM geometry breakdown structure according to the present invention sets the range of a GBS based on previously generated BIM framework variables.

A GBS element definition module 200 generates "standard information breakdown property information" that is used to manage work-type breakdown and location breakdown, "PNS property information" that is used to manage a WBS, a CBS, and an MBS, and "GBS property information" that is used to define geometric information (the property values of a 3D-CAD or an IFC viewer program).

A GBS geometric object coding module 300 matches geometric objects to the "standard information breakdown property information" and the "PNS property information" generated by the GBS element definition module 200, and assigns numbers corresponding to the "GBS property information" to the matched geometric objects.

Figure 2:
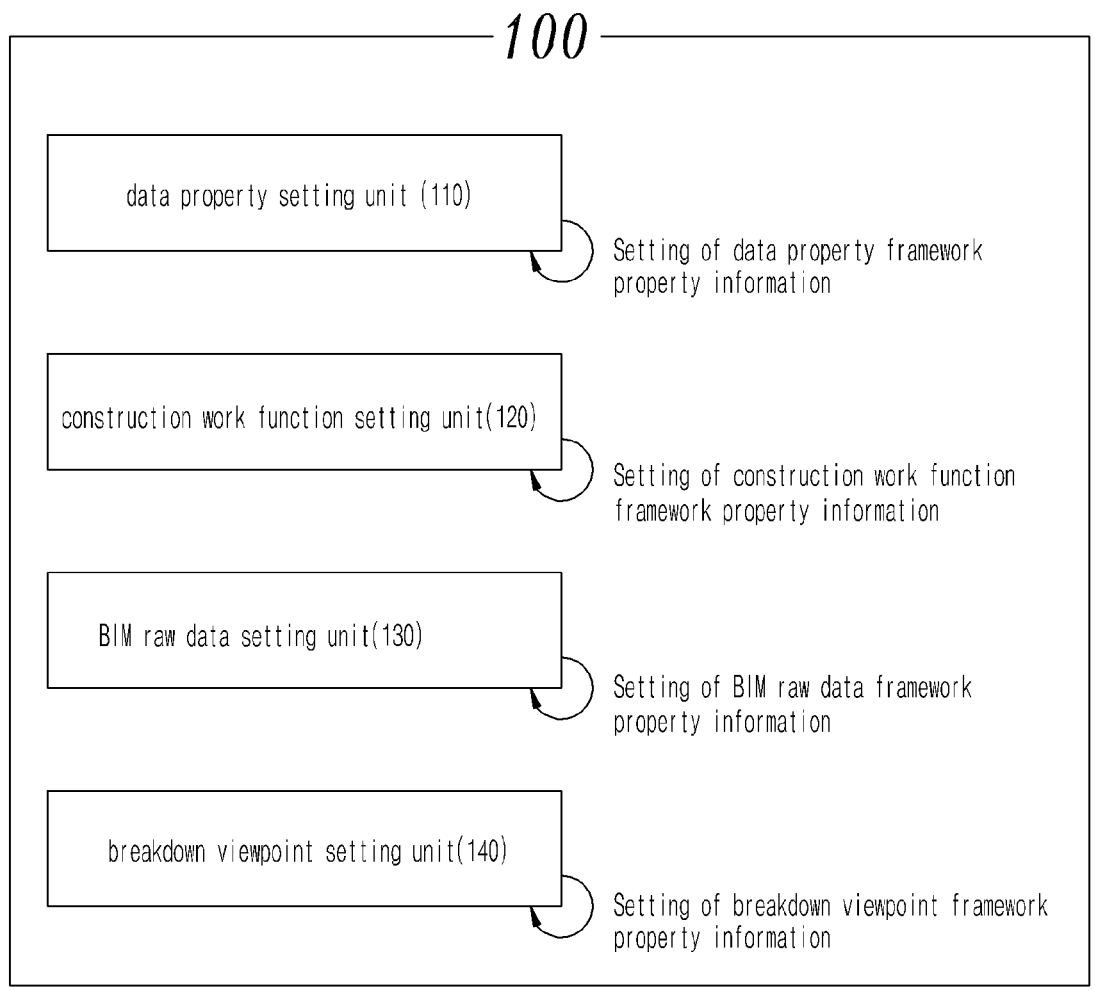
FIG. 2 is a diagram illustrating the detailed configuration of the GBS range setting module of the system for generating a BIM geometry breakdown structure according to the present invention.

The GBS range setting module 100 of the system S for generating a BIM geometry breakdown structure according to the present invention will be described below with reference to FIG. 2.

More specifically, the data property setting unit 110 of the GBS range setting module 100 sets "data property framework property information" including a geometric property and a non-geometric property.

A construction business function setting unit 120 sets "construction business function framework property information" including design, an estimate, a schedule, and cost details.

A BIM raw data setting unit 130 sets "BIM raw data framework property information" that is used to associate raw data, corresponding to a low information level, with each other.

A breakdown viewpoint setting unit 140 sets "breakdown viewpoint framework property information" including work-type and location breakdown properties.

The above-described "data property framework property information," "construction business function framework property information," "BIM raw data framework property information" and "breakdown viewpoint framework property information" are as shown in the following Table 1:

TABLE 1

Elements and range of GBS of present invention

| Element | Range | Remarks |
| --- | --- | --- |
| range: data property | geometric, non-geometric | D01.1/D01.2 |
| range: construction business function | design, estimate, schedule, cost | F03/F04/F05/F08 |
| range: data level | BIM raw data | D02.3 |
| range: breakdown viewpoint | work-type breakdown, location breakdown | D03.1/D03.2 |
| element: standard information breakdown | location information: facility, space, object work-type information: high-level work type, middle-level work type, work-type item | |
| element: PNS | GBS WBS CBS MBS | |

Figure 3:
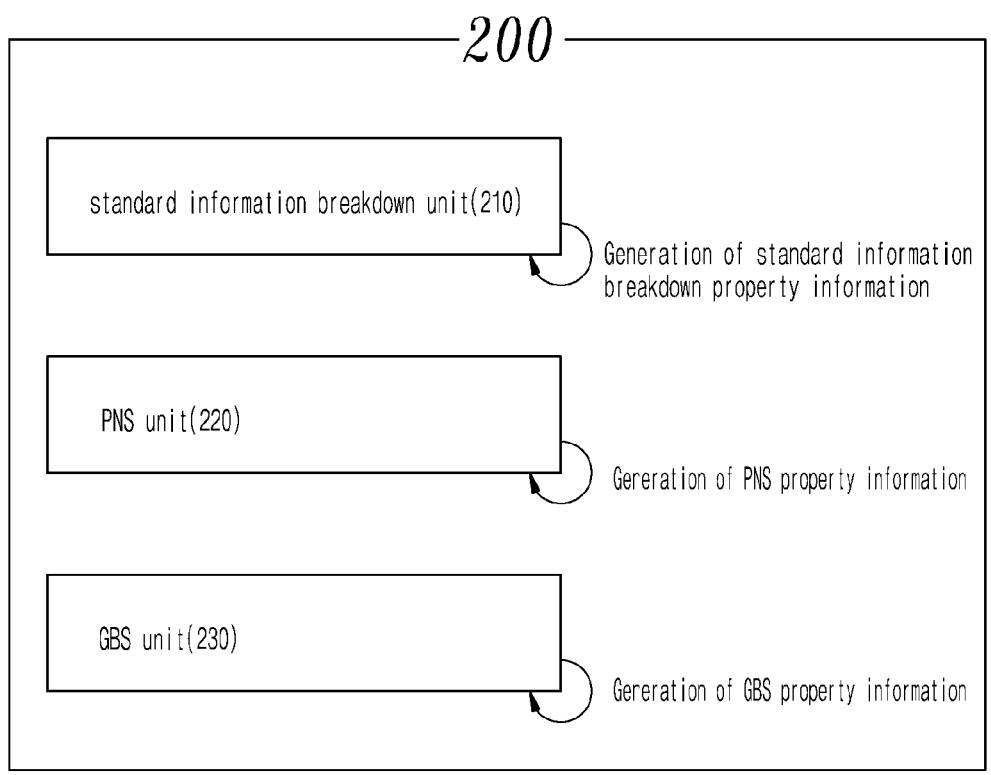
FIG. 3 is a diagram illustrating the detailed configuration of the GBS element definition module of the system for generating a BIM geometry breakdown structure according to the present invention.

The GBS element definition module 200 of the system S for generating a BIM geometry breakdown structure according to the present invention will be described with reference to FIG. 3.

More specifically, the standard information breakdown unit 210 of the GBS element definition module 200 generates "standard information breakdown property information" that is used to manage work-type breakdown and location breakdown related to geometric objects.

A PNS unit 220 generates "PNS property information" that is used to manage a WBS for managing a process range, a schedule, a cost and an estimate, and a CBS and an MBS including work items included in a cost estimate specification representative of details of a construction cost.

A GBS unit 230 generates "GBS property information" that is used to define the geometric information (the property values of the 3D-CAD or IFC Viewer program) corresponding to the "standard information breakdown property information" and the "PNS property information."

Figure 4:
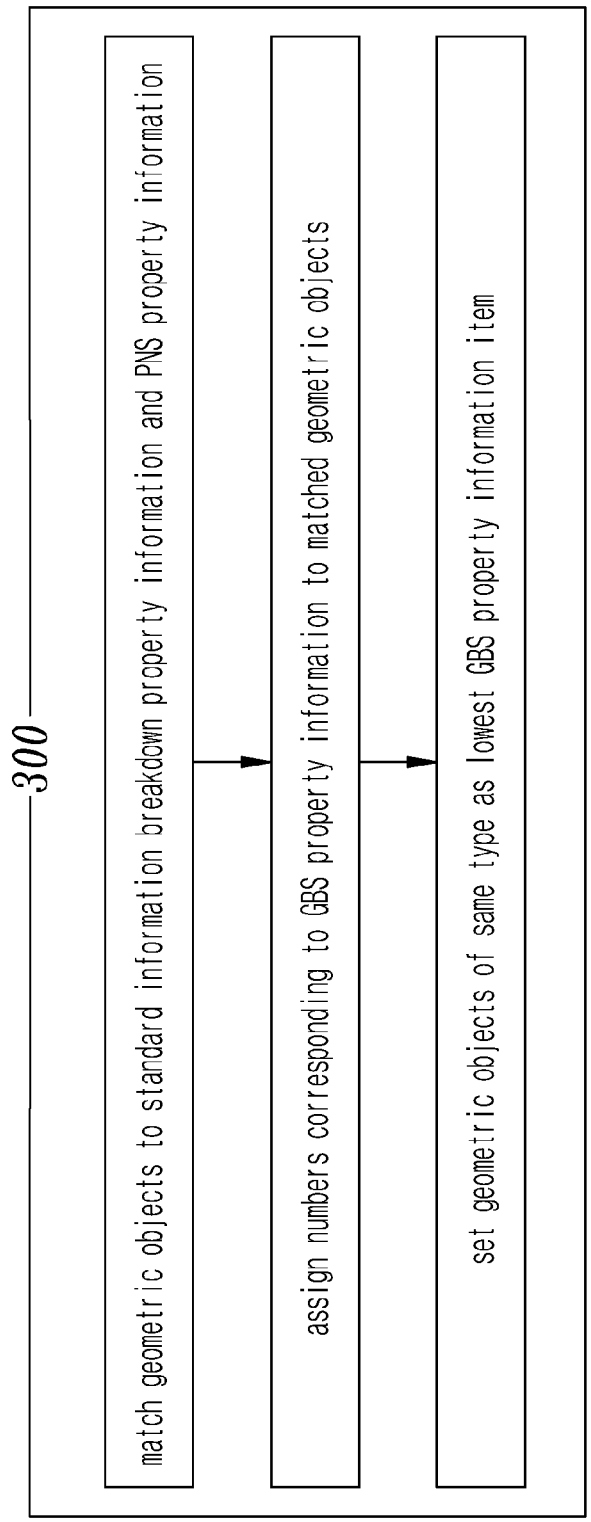
FIG. 4 is a diagram illustrating the detailed configuration of the GBS geometric object coding module of the system for generating a BIM geometry breakdown structure according to the present invention.

The GBS geometric object coding module 300 of the system S for generating a BIM geometry breakdown structure according to the present invention will be described with reference to FIG. 4.

More specifically, the GBS geometric object coding module 300 matches the geometric objects to the "standard information breakdown property information" and the "PNS property information" that are generated by the GBS element definition module 200, assigns numbers corresponding to the "GBS property information" to the matched geometric objects, and sets geometric objects of the same type (for example, a type having the same geometric size as location breakdown) as the lowest "GBS property information" item.

Cases of the application of the system S for generating a BIM geometry breakdown structure according to the present invention will be described below with reference to FIGS. 5 to 7 and Tables 2 to 5.

To check the practical applicability of the GBS proposed according to the present invention, a PNS including a GBS, a WBS, a CBS, and an MBS was developed for and applied to a housing construction case.

The case building was actually built as a mock-up house. During construction, application was performed based on field data, such as a design drawing, a cost estimate, a schedule, and productivity. The following description will be given, with a focus on the development and application of the GBS.

1. Background of Case Project: Research and Development of New Korean-Style Houses "The research and development of a new Korean-style house" that inherited a brand value by incorporating a style of traditional Korean-style houses, ensured popular appeal based on its inexpensive cost, and exhibited a high level of habitability suitable for the modern lifestyle started in 2010. This embraces "the development of a new Korean-style house model," "the development of a construction system," and "the development of performance elements" to realize mass production and distribution, and covers the development of distribution policies, construction design, members and construction methods, an automated member manufacturing system, a construction management scheme, and an information system (see Wang-jik Kim. Development of HANOK technology 1-1$^{st}$ group: Cutting-edge Urban Development of HANOK technology workshop presentation, September 2011, Seoul).

The research and development of industrial new Korean-style houses based on a standard floor plan provides an efficient scheme for practical implementation, and also enables the establishment of the basis of a mass production system. Throughout the entire process, the sharing of information and knowledge among all of owner, design and construction organizations serves as a basic foundation for the industrial activation of new Korean-style houses. With this in mind, Youngsoo Jung et al.'s research (Youngsoo Jung et al., "Standard Classifications and Project Numbering System for Integrated Construction Management of Modernized Korean Housing (Hanok)", Transactions of the Society of CAD/CAM Engineers, Vol. 17, No. 4, pp. 225~233, August 2012) analyzed the requirements for the management of the construction of new Korean-style houses, and developed a new Korean-style house standard information breakdown structure and cost and schedule PNS.

2. Characteristics and Breakdown Structure of Management of Construction of New Korean-Style Houses In summary, the construction of new Korean-style houses is characterized in that 1. "the expected effect of an industrial standard" is high because new Korean-style houses are frequently used by many unspecified persons as small-scale residences, 2. the relative importance of "wood work, window and door work, and roof work" that are not addressed by a general standard is very high, and 3. the factory production of a maximum number of members is pursued to reduce construction costs and realize mass distribution.

Because of the above characteristics of the management of the construction of new Korean-style houses, the standard breakdown structure has the characteristics that 1. "the utility of facility/space/object-based composite breakdown" is high in the schedule and cost management, 2. "the standard utilization of middle-level work-type breakdown" in work-type breakdown is more efficient, and 3. the standard has "a higher degree of details" than other standards, unlike that for the management of a general construction project (see Youngsoo Jung et al. (2012)).

Youngsoo Jung et al. (2012) developed a PNS embracing a WBS, a CBS, and an MBS in the form of an industrial standard based on the characteristics of the construction and breakdown of new Korean-style houses. In the PNS, the WBS and the CBS were defined to be suitable for integrated schedule/cost management, and the MBS and the CBS were defined as structures that have different degrees of details but perform the collection and analysis of data together. That is, as shown in Table 2, the three breakdown structures have ensured the association of data.

TABLE 2

Characteristics of management of construction of new Korean-style houses (see Youngsoo Jung et al. (2012))

| Viewpoint | Characteristics of new Korean-style houses | Characteristics of management of construction |
|---|---|---|
| facility | construction of small-scale houses, participation of small-scale companies | improvement of general user convenience and standard utilization |
| structure | wooden frame structure, complicated roof structure, two or less-story structure | emphasis on wood/windows and doors/roof, separate management of spaces |
| construction method | focus on factory production, field assembly and joining, and airtightness | standardization of factory production, flexibility of standard specification, industrial standardization |

3. Information Breakdown and PNS for New Korean-Style Houses

The outline of the new Korean-style house "standard information breakdown" and "PNS" defined in preceding research (see Youngsoo Jung et al. (2012)) are shown in Table 3, and a numbering system suitable for new Korean-style house characteristics was developed to incorporate all of the components of modern residence and traditional architecture therein. Referring to the standard information breakdown, three facet breakdowns, that is, facility, space and work-type breakdowns, were defined, and, in the case of the work-type breakdown, higher-level work-type breakdown and middle-level breakdown were standardized together. The middle-level work-type breakdown was defined chiefly for the standardization of a schedule.

The PNS was set up through the combination of the component breakdowns of the standard information breakdown, the WBS was described based on the space breakdown A2 and the middle-level work-type breakdown A4, and the CBS was defined based on the space breakdown A2 and itemized work-type breakdown A5. Both the two were selected as methods for maximizing the efficiency of practical work.

However, to associate the new Korean-style house WBS, CBS and MBS with 3D-CAD, schedule, cost and estimate relationships should be designated for each object. In accordance with the object of the present invention, a geometry breakdown structure configuration method and a numbering system for "the convenience of the practical use of BIM" and "the ease of the association with non-geometric information" have been additionally developed (see Table 4), and were applied to an experimental house for new Korean-style houses in order to validate practical applicability. The experimental house is a mock-up house for research that was actually built on the campus of Myongji University. The new Korean-style house construction method was applied to a two-story wooden house structure having a total floor area of 127 m$^2$.

TABLE 3

Standard information breakdown and PNS for new Korean-style houses (see Youngsoo Jung et al. (2012))

| Classification | Item | Remarks |
|---|---|---|
| A0 standard information breakdown | | |
| A1 facility breakdown | 4 | breakdown based on concept of building within residence |
| A2 space breakdown | 7 | vertical story, element breakdown |
| A3 work-type breakdown (high level) | 15 | |
| A4 work-type breakdown (middle level) | 50 | |
| A5 work-type breakdown (item) | 231 | |
| B0 PNS | | |
| B1 standard work breakdown, WBS | | A1-A2-A4 |
| B2 standard cost breakdown, CBS | | A1-A2-A3-Serial-A5 |
| B3 standard-method-of-measurement breakdown, MBS | | A5-Serial |

TABLE 4 geometry breakdown structure for New Korean-style houses (added by present research)

| Classification | Item | Remarks |
|---|---|---|
| A0 standard information breakdown | | |
| A6 geometry breakdown (high level) | 6 | |
| A7 geometry breakdown (middle level) | 35 | |
| A8 geometry breakdown (low level) | 49 | |
| A9 geometry breakdown (item) | 120 | |

TABLE 4-continued geometry breakdown structure for New Korean-
style houses (added by present research)

| Classification | Item | Remarks |
|---|---|---|
| B0 PNS | | |
| B4 geometrical geometry breakdown structure, GBS | | A1-A2-A7-A9 |

4. GBS Configuration and Structure for New Korean-Style Houses

To design the concept of GBS configuration, first, a structure was analyzed while an as-built drawing of a new Korean-style house mock-up was being drawn using a 3D CAD program. The schedule and cost association of the GBS was taken into consideration by performing the breakdown of new Korean-style house BIM objects in accordance with the hierarchy of the following Table 5 while applying standard processes and standard details together (see Youngsoo Jung et al. (2012)) during CAD work.

Figure 5A:
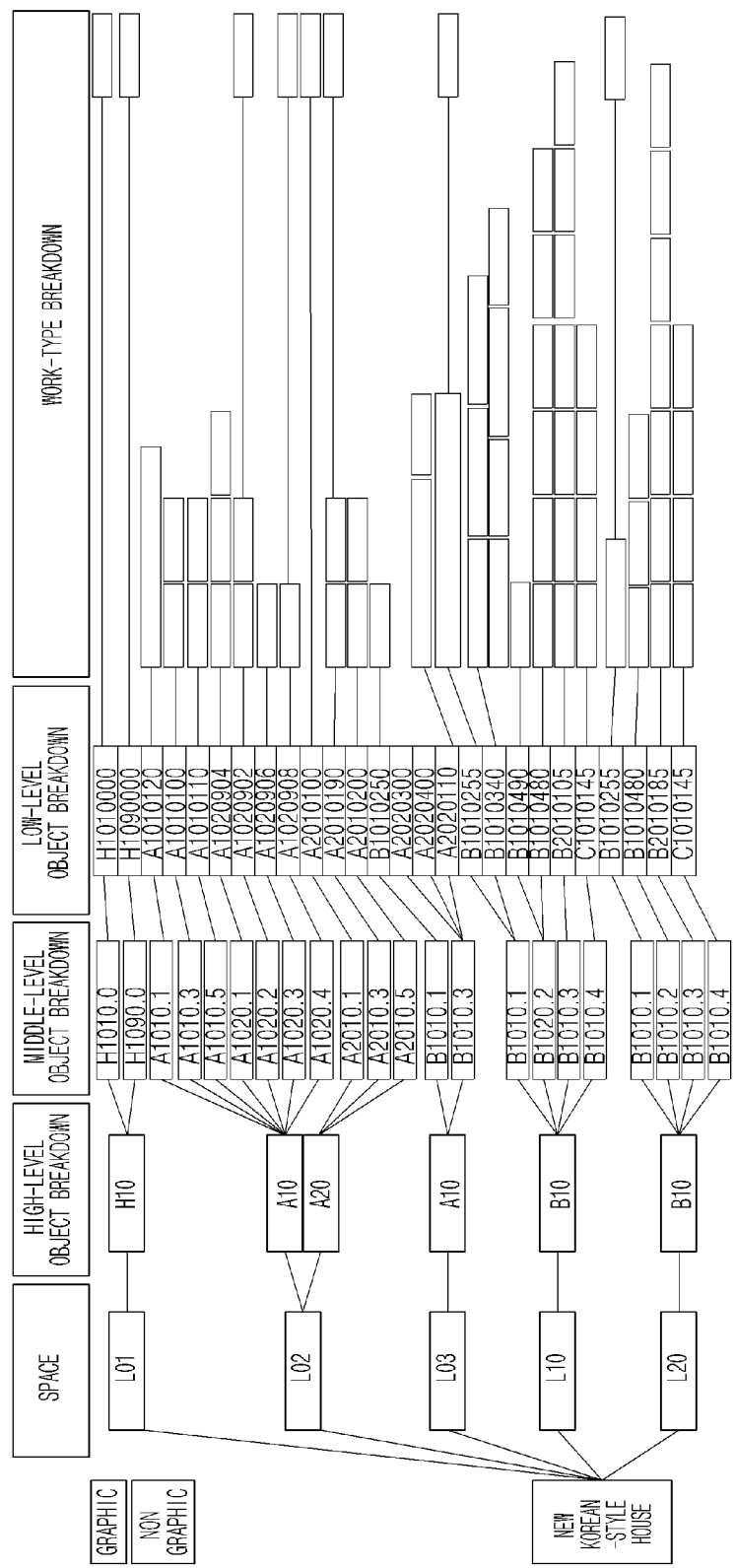
FIGS. 5A and 5B is a diagram illustrating an example of the "object hierarchical breakdown of a new Korean-style house construction GBS" based on the system for generating a BIM geometry breakdown structure according to the present invention.
Figure 5B:
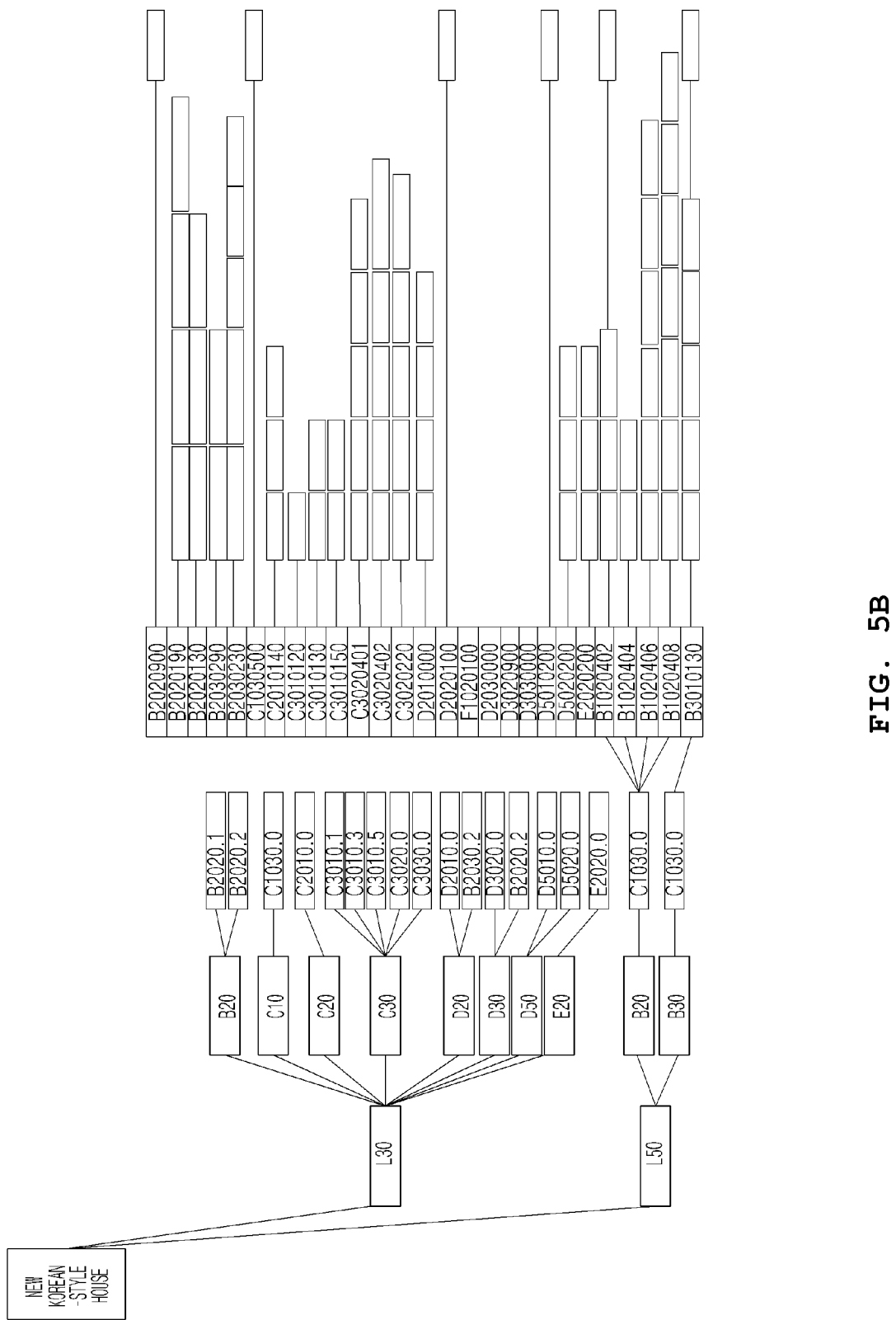
Figure 6:
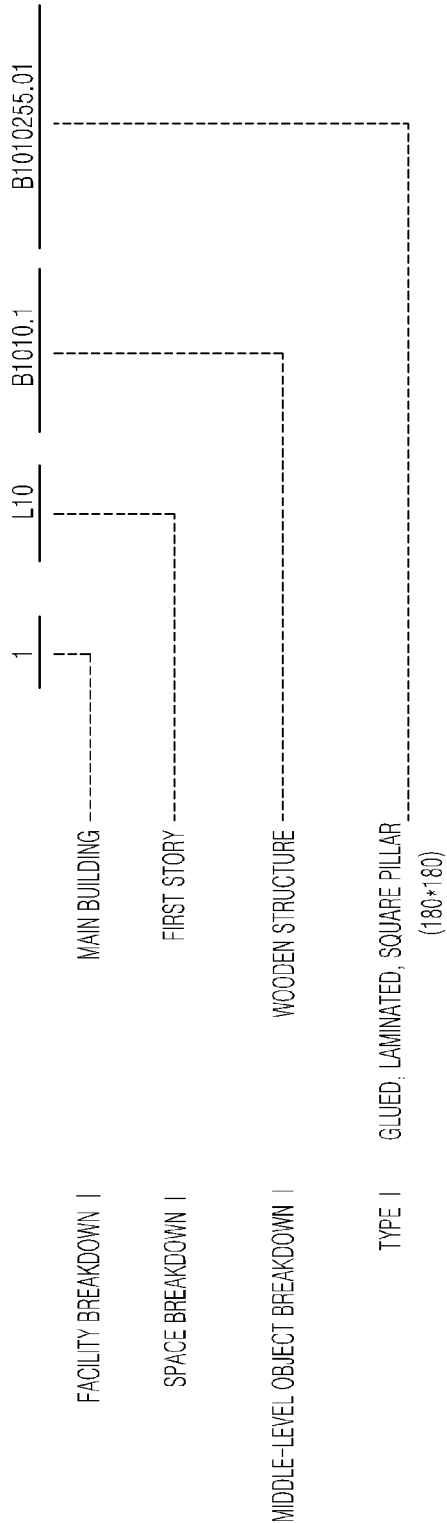
FIG. 6 is a diagram illustrating an example of a "new Korean-style house construction standard GBS numbering system" based on the system for generating a BIM geometry breakdown structure according to the present invention.

A first level (GBS_01 of Table 5) corresponds to the distinctions between the buildings of a project (a main building, an ancillary building, etc.), and is intended for a single new Korean-style house main building in this cost estimate (see FIGS. 5A and 5B).

In a second facet, that is, space breakdown, the distinctions between physical spaces (a foundation, a basement, a first floor, etc.) have been defined, and seven classes have been defined chiefly based on the floor-based distinctions in light of the simplicity of house construction (see GBS_02).

A third level GBS_03 corresponds to highest-level geometry breakdown, and defines 16 classes including a foundation, a stylobate, a wooden structure, and a roof. Furthermore, breakdown to middle-level breakdown, that is, 40 classes, is performed.

A fourth level GBS_04 corresponds to middle-level breakdown from an object viewpoint, and enables BIM practical utility to be increased by giving definitions chiefly based on the function of associating schedule management. That is, conformity to standard work breakdown (WBS; B1 of Table 3) based on the work-type middle-level breakdown (A4 of Table 3) of a new Korean-style house is achieved, and thus the fourth level is used as a basis for automatic association with the schedule.

A fifth level GBS_05 corresponds to the last breakdown from the object viewpoint, and is set as a criterion for the creation of objects. For example, it represents the entire floor formed of a combination of various members, such as a lumber, plywood, sheet, and finishing materials. In the new Korean-style house of the case, 49 classes were defined. A sixth level GBS_06 corresponds to an object template level (the family type of commercial software) in a CAD program, and is a criterion for the creation of actual objects. That is, in the case of Table 5, several 2×4 floor sleepers are represented by a single detailed template in GBS_05. Accordingly, each 2×4 lumber is an individual object of the last level GBS_07.

TABLE 5

GBS configuration of new Korean-style house case project

| Level | Facet | Main purpose | Number | Example |
|---|---|---|---|---|
| GBS_01 | facility | distinctions between facility buildings | 1 | main building |
| GBS_02 | space | distinctions between physical spaces | 7 | first story |
| GBS_03 | object_high | distinctions between functional objects | 16 | interior finishing |
| GBS_04 | object_middle | schedule management | 40 | floor finishing |
| GBS_05 | object_low | object creation | 49 | wooden floor |
| GBS_06 | work-type_high | quantity take-off | 120 | 2 × 4 square member |
| GBS_07 | work type_low | lowest CAD object | 6390 | object |

Since individual detailed units of GBS_06, that is, the sixth level, are the lowest object classes of the same work-type, the total of quantities is calculated here, and thus cost items based on standard cost breakdown structure (B3 of Table 3) are associated with each other as a relational database.

5. Assignment of GBS Numbers for New Korean-Style Houses.

As described above, the methodology was validated by performing the tasks of assigning GBS numbers in the as-built drawing of a new Korean-style house presented in Table 5 and associating a schedule with cost items.

First, since assigning a number to each object at the lowest level in order to simply associate a schedule activity with cost estimate items has expected effects that are low compared to input efforts, efficiency can be improved by assigning an automatically generated two-digit serial number to GBS_06 with regard to the GBS_07 number of each object. Accordingly, the lowest number that is intentionally assigned corresponds to GBS_06 (see FIG. 6).

As shown in B4 of Table 4, this includes facility breakdown A1—space breakdown A2—middle-level geometry breakdown A7—item geometry breakdown A9, and is represented by a total of 20 digits. In the case of new Korean-style houses, the numbering target templates of GBS_06 is 120 in number, which can be achieved with a little effort.

Another consideration is that the numbers assigned based on GBS_06 should not require repetitive tasks regardless of changes in design. For this purpose, during 3D-CAD work, 120 templates were defined and used by a user. Since this task is performed by modifying and then using templates that are provided by existing software, the excessive burden of additional work is avoided.

In particular, there is the advantage of not requiring a task of associating schedule activities with respective objects again upon a change in design or upon the re-creation of a drawing in association with the schedule. That is, regardless of any change in design or any re-creation, the schedule and cost association is automatically performed based on the GBS numbers that were assigned in the initial stage of the work.

When viewed from the viewpoint of the burdensome work of GBS numbering, 120 numbers are assigned at the GBS_06 level as described above, 120 numbers are automatically assigned at levels from GBS_01 to GBS_05 above the GBS_06 level, and then 6,400 numbers are automatically assigned at the GBS_07 level below the GBS_06 level.

Figure 7:
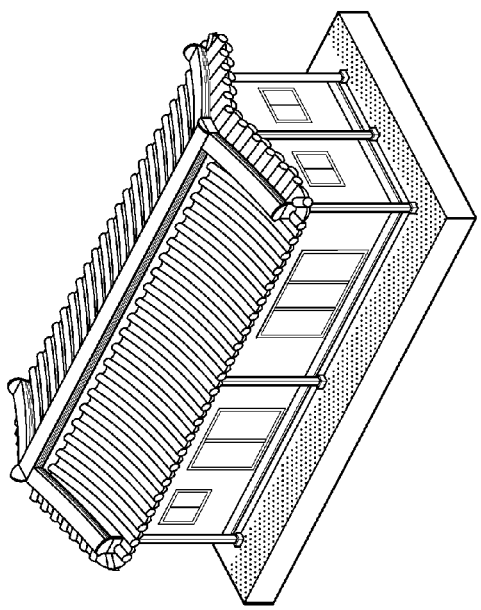
FIG. 7 is a diagram illustrating an example of "new Korean-style house GBS numbering" based on the system for generating a BIM geometry breakdown structure according to the present invention.

Furthermore, as shown in FIG. 7, a single template ("a 180×180"-type first floor pillar in FIG. 7) defines a one-story wooden pillar, and pillars in blue on the left side of FIG. 7 are objects that belong to GBS_06.

Meanwhile, referring to the property definition on the right side of FIG. 7, GBS_01 (1) to GBS_05

(1L10B10101B1010255) are automatically generated by the GBS numbering (1L10B10101B101025501) that is assigned upon the performance of a 3D geometric definition.

Using the above-described method, the numbering system for all objects is managed at a minimum expenditure of effort, and 100% of the total construction cost may be shared in the 3D CAD, the schedule, and the cost estimate.

Figure 8:
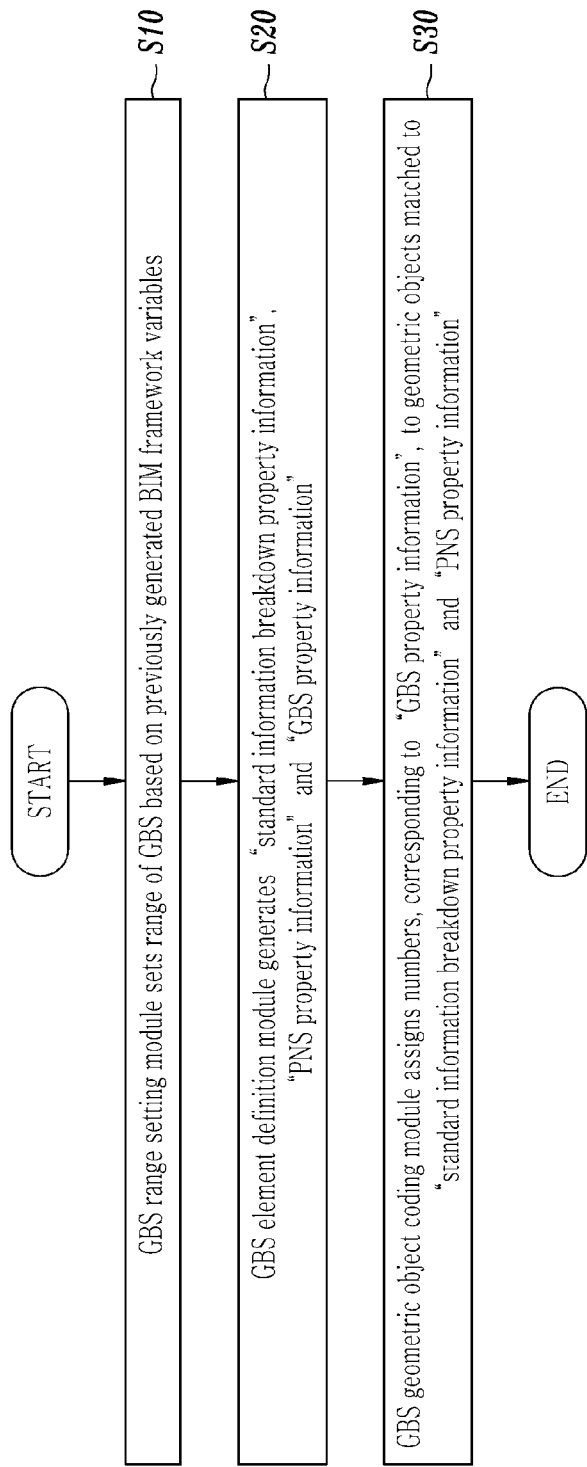
FIG. 8 is a flowchart illustrating a method of generating a BIM geometry breakdown structure according to the present invention.

A method of generating a BIM geometry breakdown structure according to the present invention will be described below with reference to FIG. 8.

First, the GBS range setting module 100 sets the range of the GBS based on previously generated BIM framework variables at step S10.

Thereafter, the GBS element definition module 200 generates "standard information breakdown property information" that is used to manage work-type breakdown and location breakdown, "PNS property information" that is used to manage a WBS, a CBS, and an MBS, and "GBS property information" that is used to define geometric information (the property values of a 3D-CAD or an IFC viewer program) at step S20.

Furthermore, the GBS geometric object coding module 300 matches geometric objects to the "standard information breakdown property information" and the "PNS property information" generated by the GBS element definition module 200, and assigns numbers corresponding to the "GBS property information" to the matched geometric objects at step S30.

Figure 9:
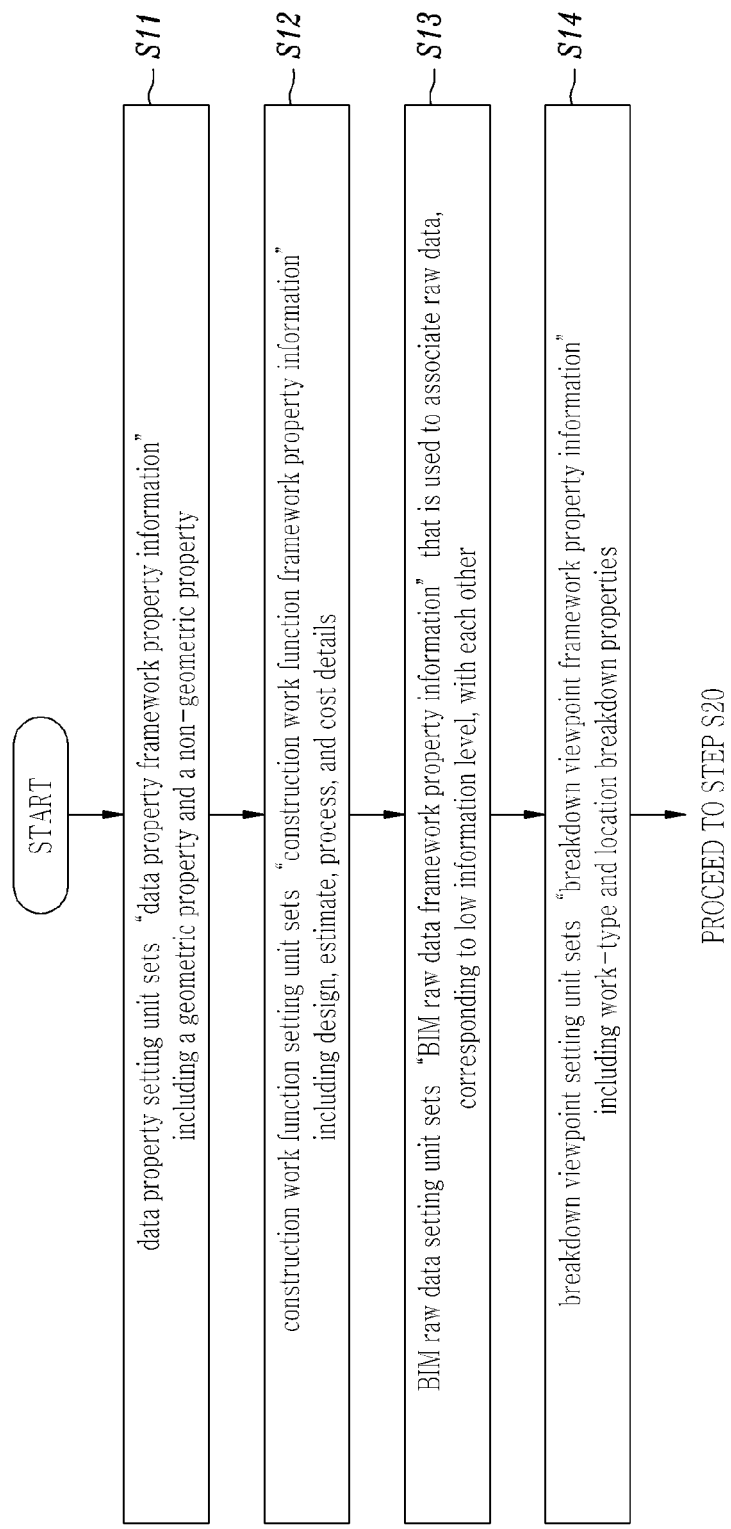
FIG. 9 is a flowchart illustrating the detailed process of step S10 of the method of generating a BIM geometry breakdown structure according to the present invention.

The detailed process of step S10 of the method of generating a BIM geometry breakdown structure according to the present invention will be described below with reference to FIG. 9.

First, the GBS range setting module 100 sets "data property framework property information" including a geometric property and a non-geometric property at step S11.

Thereafter, the GBS range setting module 100 sets "construction business function framework property information" including design, an estimate, a schedule, and cost details at step S12.

Thereafter, the GBS range setting module 100 sets "BIM raw data framework property information" that is used to associate raw data, corresponding to a low information level, with each other at step S13.

Furthermore, the GBS range setting module 100 sets "breakdown viewpoint framework property information" including work-type and location breakdown properties at step S14.

Figure 10:
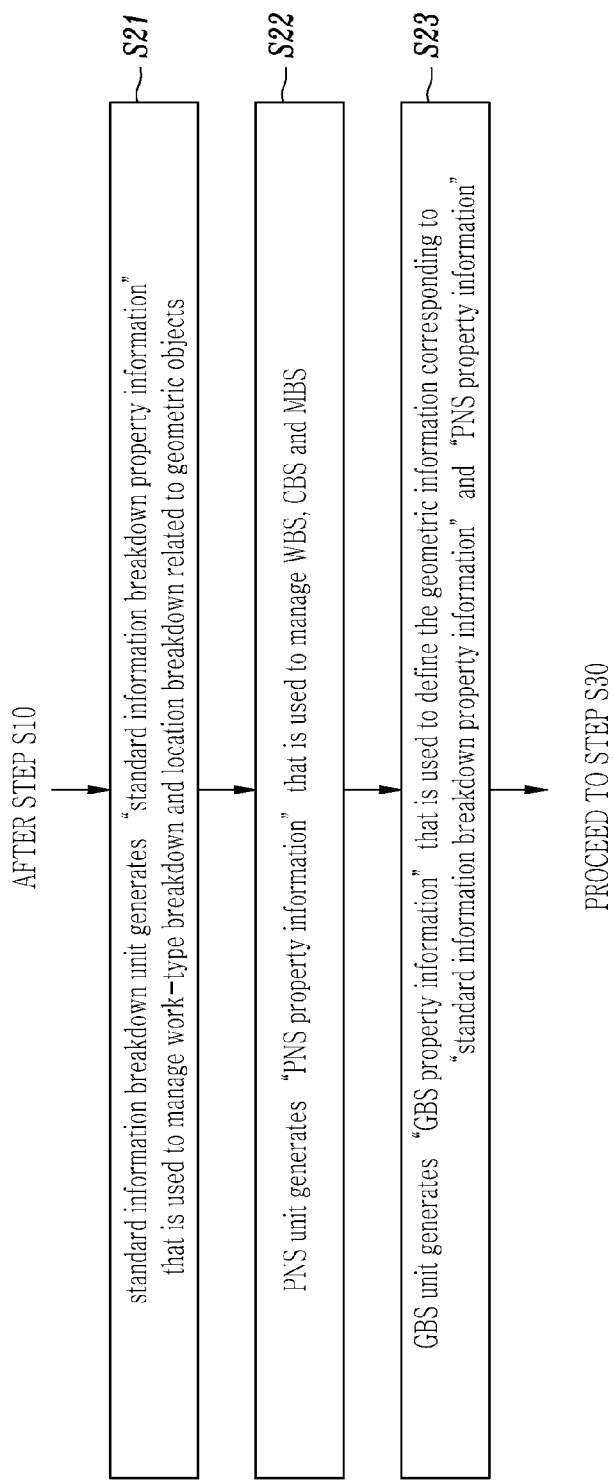
FIG. 10 is a flowchart illustrating the detailed process of step S20 of the method of generating a BIM geometry breakdown structure according to the present invention.

The detailed process of step S20 of the method of generating a BIM geometry breakdown structure according to the present invention will be described below with reference to FIG. 10.

After step S10, the GBS element definition module 200 generates "standard information breakdown property information" that is used to manage work-type breakdown and location breakdown related to geometric objects at step S21.

Thereafter, the GBS element definition module 200 generates "PNS property information" that is used to manage a WBS for managing a process range, a schedule, a cost and an estimate, and a CBS and an MBS including work items included in a cost estimate specification representative of details of a construction cost at step S22.

Furthermore, the GBS element definition module 200 generates "GBS property information" that is used to define the geometric information (the property values of the 3D-CAD or IFC Viewer program) corresponding to the "standard information breakdown property information" and the "PNS property information" at step S23.

Figure 11:
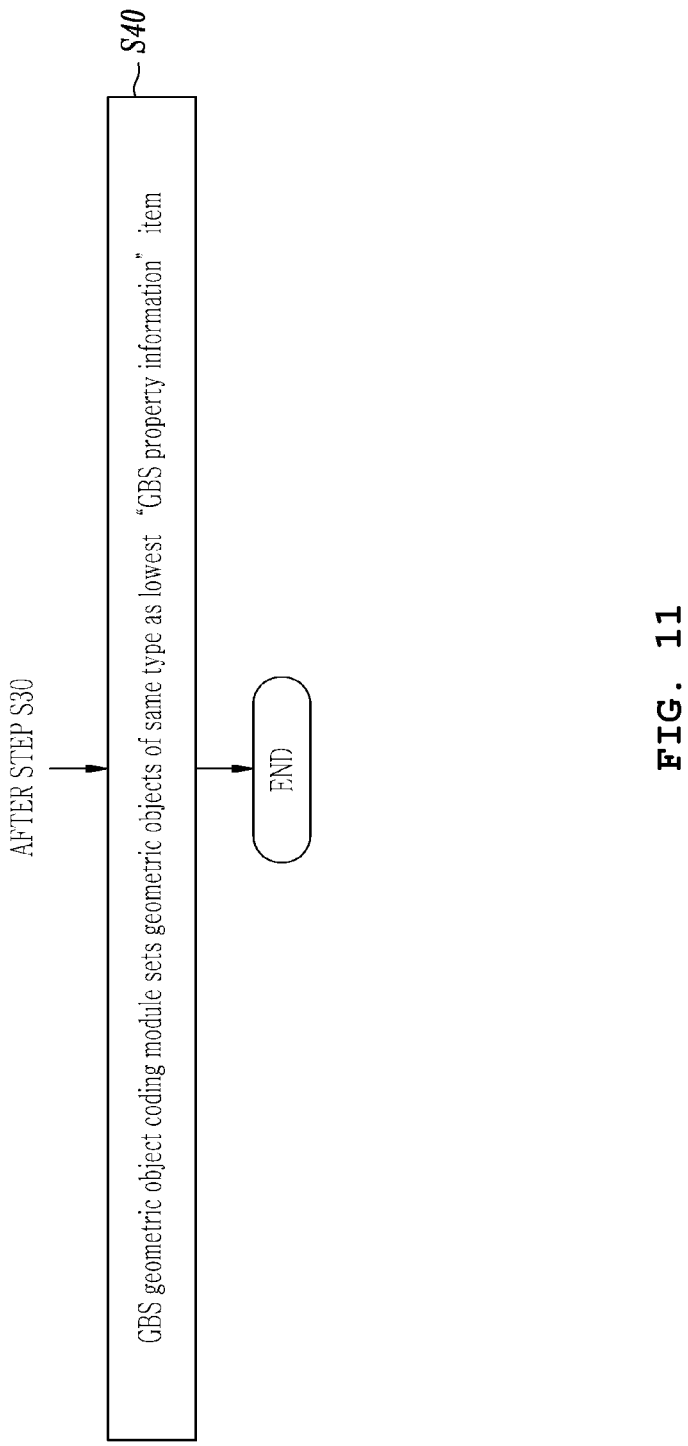
FIG. 11 is a flowchart illustrating the process that follows step S30 of the method of generating a BIM geometry breakdown structure according to the present invention.

The process that follows step S30 of the method of generating a BIM geometry breakdown structure according to the present invention will be described below with reference to FIG. 11.

After step S30, the GBS geometric object coding module 300 sets geometric objects of the same type (for example, a type having the same geometric size as location breakdown) as the lowest "GBS property information" item at step S40.

In accordance with the present invention, there is provided a system and method for generating a BIM geometry breakdown structure, which are capable of acquiring PNS association requirements suitable for BIM geometry breakdown characteristics, thereby generating the framework of a PNS that provides geometric information that enables the comprehensive integration of a WBS and a CBS.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A system for generating a building information modeling (BIM) geometry breakdown structure, comprising:
    a computer device; and
    a non-transitory storage medium containing program instructions, execution of which by the computer device causes the system to provide functions of:
    a geometry breakdown system (GBS) range setting module configured to set a range of a GBS based on previously generated BIM framework variables;
    a GBS element definition module configured
    to generate standard information breakdown property information that is used to manage work-type breakdown and location breakdown,
    to generate project numbering system (PNS) property information that is used to manage a work breakdown system (WBS), a cost breakdown structure (CBS), and a standard-method-of-measurement (SMM) breakdown structure (MBS), and
    to generate GBS property information that is used to define geometric information; and
    a GBS geometric object coding module configured
    to match geometric objects to the standard information breakdown property information and the PNS property information generated by the GBS element definition module, and
    to assign numbers corresponding to the GBS property information to the matched geometric objects.

2. The system of claim 1, wherein the GBS range setting module sets the range of the GBS based on the previously generated BIM framework variables, and comprises:
    a data property setting unit configured to set data property framework property information including a geometric property and a non-geometric property;
    a construction business function setting unit configured to set construction business function framework property information including design, an estimate, a schedule, and cost details;
    a BIM raw data setting unit configured to set BIM raw data framework property information that is used to associate raw data, corresponding to a low information level, with each other; and
    a breakdown viewpoint setting unit configured to set breakdown viewpoint framework property information including work-type and location breakdown properties.

3. The system of claim 1, wherein the GBS element definition module comprises:
- a standard information breakdown unit configured to generate the standard information breakdown property information that is used to manage the work-type breakdown and the location breakdown related to the geometric objects;
- a PNS unit configured to generate the PNS property information that is used to manage the WBS for managing a process range, a schedule, a cost and an estimate, and the CBS and the MBS including work items included in a cost estimate representative of details of a construction cost; and
- a GBS unit configured to generate the GBS property information that is used to define the geometric information corresponding to the standard information breakdown property information and the PNS property information.

4. The system of claim 1, wherein the GBS geometric object coding module is configured to:
- assign numbers corresponding to the GBS property information to the matched geometric objects; and
- set geometric objects of a same type as a lowest GBS property information item.

5. The system of claim 4, wherein the same type is a type having a same geometric size as the location breakdown.

6. The system of claim 1, wherein the geometric information includes property values of a three-dimensional computer-aided design (3D-CAD) or of an Industry Foundation Classes (IFC) viewer program.

7. A method of using a building information modeling (BIM) geometry breakdown structure generating system to generate a BIM geometry breakdown structure, the BIM geometry breakdown structure generating system including
- a computer device; and
- a non-transitory storage medium containing program instructions, execution of which by the computer device causes the system to provide functions of a geometry breakdown system (GBS) range setting module, a GBS element definition module and a GBS geometric object coding module, the method comprising:
  - (a) setting, by the computer device via the GBS range setting module, a range of a GBS based on previously generated BIM framework variables;
  - (b) generating, by the computer device via the GBS element definition module, standard information breakdown property information that is used to manage work-type breakdown and location breakdown,
  - project numbering system (PNS} property information that is used to manage a work breakdown system (WBS), a cost breakdown structure (CBS), and a standard-method-of-measurement (SMM) breakdown structure (MBS), and
  - GBS property information that is used to define geometric information; and
  - (c) matching, by the computer device via the GBS geometric object coding module, geometric objects to the standard information breakdown property information and the PNS property information generated by the GBS element definition module, and assigning, by the computer device via the GBS geometric object coding module, numbers corresponding to the GBS property information to the matched geometric objects.

8. The method of claim 5, wherein the GBS range setting module includes a data property setting unit, a construction business function setting unit, a BIM raw data setting unit and a breakdown viewpoint setting unit; and
- step (a) comprises:
  - (a-1) setting, by the computer device via the data property setting unit, data property framework property information including a geometric property and a non-geometric property;
  - (a-2) setting, by the computer device via the construction business function setting unit, construction business function framework property information including design, an estimate, a schedule, and cost details;
  - (a-3) setting, by the computer device via the BIM raw data setting unit, BIM raw data framework property information that is used to associate raw data, corresponding to a low information level, with each other; and
  - (a-4) setting, by the computer device via the breakdown viewpoint setting unit, breakdown viewpoint framework property information including work-type and location breakdown properties.

9. The method of claim 7, wherein the GBS element definition module includes a standard information breakdown unit, a PNS unit and a GBS unit; and
- step (b) comprises:
  - (b-1) generating, by the computer device via the standard information breakdown unit, the standard information breakdown property information that is used to manage the work-type breakdown and the location breakdown related to the geometric objects;
  - (b-2) generating, by the computer device via the PNS unit, the PNS property information that is used to manage the WBS for managing a process range, a schedule, a cost and an estimate, and the CBS and the MBS including work items included in a cost estimate specification representative of details of a construction cost; and
  - (b-3) generating, by the computer device via the GBS unit, the GBS property information that is used to define the geometric information corresponding to the standard information breakdown property information and the PNS property information.

10. The method of claim 7, further comprising, after step (c), (d) setting, by the computer device via the GBS geometric object coding module, geometric objects of a same type as a lowest OBS property information item.

11. The method of claim 10, wherein the same type is a type having a same geometric size as the location breakdown.

12. The method of claim 7, wherein the geometric information includes property values of a three-dimensional computer-aided design (3D-CAD) or of an Industry Foundation Classes (IFC) viewer program.

* * * * *